United States Patent [19]

Yabu et al.

[11] Patent Number: 4,869,481
[45] Date of Patent: Sep. 26, 1989

[54] PLATE-LIKE ARTICLE HOLDING DEVICE

[75] Inventors: Shuichi Yabu; Kazuo Takahashi, both of Kawasaki; Yukio Yamane, Yokohama, all of Japan

[73] Assignee: Canon Kabushiki Kaisha

[21] Appl. No.: 217,974

[22] Filed: Jul. 12, 1988

[30] Foreign Application Priority Data

Jul. 21, 1987 [JP] Japan ................. 62-179916

[51] Int. Cl.$^4$ ............................. B23B 31/00
[52] U.S. Cl. ..................... 269/21; 279/1 E; 279/3
[58] Field of Search ............ 279/3, 1 E; 51/235; 269/21, 13; 248/362; 425/444; 414/417; 249/68; 294/64.1

[56] References Cited

U.S. PATENT DOCUMENTS

| | | | |
|---|---|---|---|
| 4,448,404 | 5/1984 | Ogawa et al. | 269/21 |
| 4,535,834 | 8/1985 | Turner | 269/21 |
| 4,747,608 | 5/1988 | Sato et al. | 279/3 |

Primary Examiner—Robert C. Watson
Attorney, Agent, or Firm—Fitzpatrick, Cella, Harper & Scinto

[57] ABSTRACT

A plate-like article holding device particularly suitably usable in an exposure apparatus for printing a pattern of a reticle or mask on a semiconductor wafer, as a wafer holding device for holding the wafer at a pattern printing station, is disclosed. In an embodiment, the holding device includes a wafer chuck having a wafer attracting surface and a plurality of throughbores formed in relation to the attracting surface. Also, the device includes a plurality of support pillars provided in relation to the throughbores, respectively, and having end faces effective to support a wafer by attraction. There is provided a driving mechanism for moving the wafer chuck in a direction substantially perpendicular to the wafer attracting surface of the chuck so as to allow that the supporting end faces of the support pillars project outwardly beyond the wafer attracting surface of the wafer chuck or, alternatively, they are accommodated within the wafer chuck. A wafer having been conveyed to the device is first attracted to and supported by the supporting pillars as they are projected from the wafer attracting surface of the chuck. Thereafter, the wafer chuck is moved by the driving mechanism so that the wafer attracting surface thereof contacts the wafer.

3 Claims, 2 Drawing Sheets

PLATE-LIKE ARTICLE HOLDING DEVICE

FIELD OF THE INVENTION AND RELATED ART

This invention relates to a holding device which is particularly suitable in an exposure apparatus for forming a pattern on a planar plate-like article such as a semiconductor wafer or a glass plate used as a base plate for a liquid crystal panel display device. More particularly, the invention is concerned with a holding device suitable to hold and place, at a predetermined loading position within an exposure apparatus, a planar plate-like article whose position or orientation has been prealigned preparatorily.

The tendency to higher degree of integration of microcircuits has forced formation of extraordinarily fine patterns. In the field of semiconductor exposure apparatuses for transferring, by exposure, a pattern formed on a reticle or mask onto a wafer after mutual alignment, projection type exposure apparatuses equipped with high-resolution lenses have been prevalently used. In such exposure apparatuses, a wafer is first relatively coarsely aligned at a prealignment stage, and thereafter, it is moved and placed on a chuck, mounted to a wafer stage, by means of a wafer conveying hand (hand mechanism). Usually, such a wafer conveying hand is of a back-side attracting type, holding a wafer by attracting the back-side (bottom face) of the wafer, in order to prevent accidental damage of the upper face of the wafer to which a photoresist material has been applied. The wafer placed on the wafer chuck is flatness-corrected by means of vacuum attraction or electrostatic attraction. Then, by the cooperation with an autofocusing mechanism, the wafer is held within the depth of focus of a projection lens system. Subsequently, it is aligned at high precision with the use of an alignment optical system and, finally, the mask pattern is transferred (printed) onto it by the projection exposure.

Accordingly, a wafer stage should be so structured that a wafer can be transferred thereto from a conveying hand of the back-side attracting type, without damaging the prealignment accuracy, and also that the wafer stage shows a capability of correction of the flatness of a wafer, suited to the depth of focus of a high-resolution projection lens system.

Referring to FIGS. 3 and 4, FIG. 3 is a plan view showing an example of known type wafer chuck of a wafer stage and a conveying hand, while FIG. 4 is a section taken on line IV—IV in FIG. 3. Denoted in FIGS. 3 and 4 at numeral 2 is a conveying hand; at 30, a wafer chuck; and at 31, a chuck supporting table. In order to allow reception of a wafer by the wafer chuck 30, the wafer being conveyed thereto with its backside attracted by the conveying hand 2, the chuck 30 is formed with a notch 32 for allowing access of the conveying hand.

While not shown in the drawings, vacuum attracting grooves are formed in the top face of the wafer chuck 30, so that a wafer when it is placed on the chuck can be flatness-corrected by the vacuum attraction.

FIG. 5 is a sectional view showing another example of known type wafer chuck of a wafer stage and a conveying hand. Denoted in FIG. 5 at numeral 1 is a wafer; at 2, a conveying hand; at 50, a wafer chuck; and at 52, a wafer abutment. Upon transfer of a wafer, the wafer abutment 52 is moved and projected upwardly beyond the wafer chuck 50 surface and a wafer 1 is temporally transferred onto the wafer abutment 52 from the conveying hand 2. Thereafter, the wafer abutment 52 moves downwardly while holding the wafer 1 by vacuum attraction, so as to place the wafer 1 on the wafer chuck 50.

In the example shown in FIGS. 3 and 4, the flatness correcting performance of the wafer chuck is deteriorated at the notch 32 portion, with the result that the flatness of the wafer is damaged locally. Accordingly, there is a disadvantageous possibility that the wafer surface goes out of the depth of focus, which results in the degradation of the resolving power. Also, in the example of FIG. 5, there is a disadvantageous possibility that the prealignment accuracy is deteriorated because the wafer abutment 52 displaces after a wafer is transferred thereonto.

SUMMARY OF THE INVENTION

It is accordingly a primary object of the present invention to provide a plate-like article holding device by which at least one of the above-described inconveniences can be avoided.

In accordance with one aspect of the present invention, a wafer chuck may be formed with a plurality of throughbores each extending perpendicularly to a wafer attracting surface of the wafer chuck. A plurality of wafer abutment pillars each having an inside evacuating passageway (vacuum supplying passageway) may be fixedly mounted to a wafer stage. The wafer chuck may be arranged to be made movable upwardly and downwardly relatively to the wafer abutment pillars, such that a wafer which is a planar plate-like article can be temporally placed on the wafer abutment pillars and, by subsequently moving the wafer chuck upwardly, it can be held on the wafer chuck by vacuum attraction or otherwise. With such an arrangement, a wafer can be transferred to and placed on a wafer chuck from a conveying hand of back-side attracting type and with the temporal intervention of wafer abutment pillars, without damaging the prealignment accuracy. Additionally, disadvantageous deterioration of the wafer flatness correcting performance can be avoided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
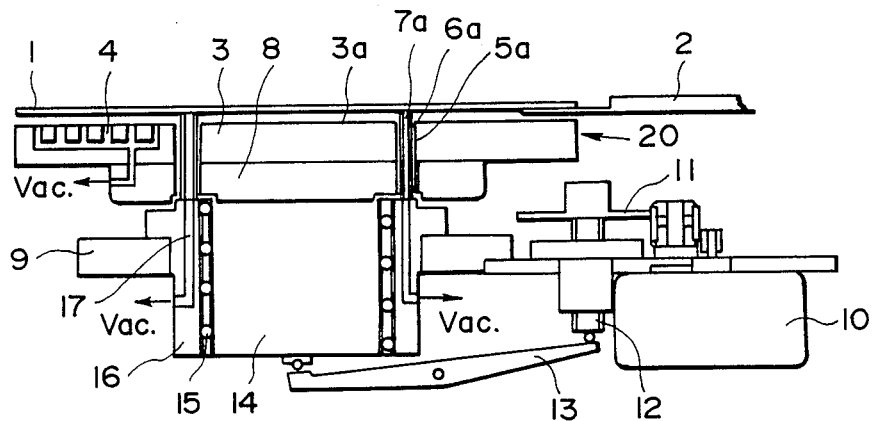
FIG. 1 is a sectional view of a wafer stage into which a plate-like article holding device according to one embodiment of the present invention is incorporated.
Figure 2:
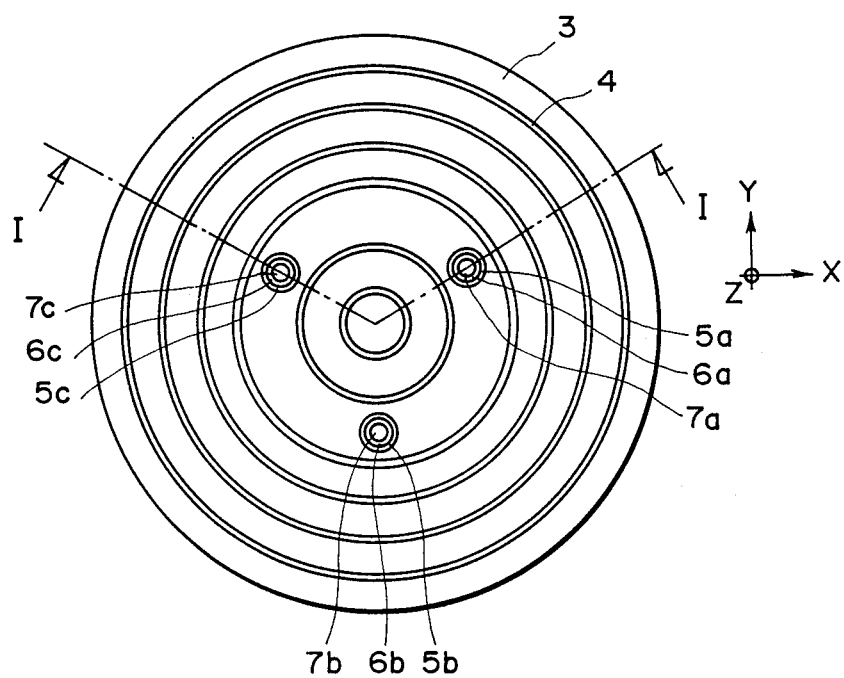
FIG. 2 is a plan view of the wafer stage of the FIG. 1 embodiment.

Referring now to FIGS. 1 and 2, FIG. 1 is a sectional view showing an embodiment of the present invention and FIG. 2 is a plan view thereof. The section of FIG. 1 has been taken on line I—I in FIG. 2. In this embodiment, the invention is applied to an article holding device which is incorporated into a wafer stage device in a semiconductor microcircuit manufacturing exposure apparatus.

Denoted in FIGS. 1 and 2 at numeral 1 is a wafer; at 2, a wafer conveying hand; at 3, a wafer chuck which has a wafer loading surface 3a extending substantially in parallel to an X-Y plane; at 4—4, wafer-attracting evacuating exhaust grooves (vacuum supplying grooves) which are formed in the wafer loading surface 3a (upper surface) of the wafer chuck 3; at 5a, 5b and 5c, throughbores which are formed in the wafer chuck 3 at equiangular positions, with a unit angle of about 120 degrees, with respect to the center of the wafer chuck 3 surface; at 6a, 6b and 6c, wafer abutment pillars; at 7a, 7b and 7c, evacuating exhaust passageways (vacuum supplying passageways) formed in the wafer abutment pillars 6a-6c, respectively; at 8, a wafer chuck support for fixedly supporting the wafer chuck 3 with respect to X and Y directions; and at 9, a base member by which the entire structure of a wafer stage device 20 is mounted to an X-Y stage (not shown). Also, denoted at 10 is a motor which functions as a drive source for moving the wafer stage 20 upwardly and downwardly in a Z direction; at 11, a gear; at 12, a ball screw; at 13, a lever; at 14, a ball bushing; at 15, ball elements; and at 16, another ball bushing operable to guide the movement of the ball bushing 14 in the upward and downward directions, with the intervention of the ball elements 15. The lever 13 is made swingable about a central pivot shaft. An end portion of the lever 13 is engageable with the lower end portion of the ball bushing 14, while another end portion of the lever is engageable with the ball screw 12. The ball screw 12 is coupled to the motor 10 by way of the gear 11. With the described arrangement, accordingly, the rotation of the motor 10 causes upward or downward movement of the ball screw 12, in response to which the lever 13 swings to thereby move the bushing 14 downwardly or upwardly.

The ball bushing guide 16 is fixedly mounted to the mounting base member 9 and, to this ball bushing guide 16, the wafer abutment Pillars 6a-6c are fixedly secured. Also, in the ball bushing guide 16, there are formed a plurality of evacuating passageways (vacuum supplying passageways) 17 which are communicated with the evacuating passageways 7a-7c, respectively, defined within the hollow or tubular wafer abutment pillars 6a-6c, respectively. On the other hand, the wafer chuck 3 is fixed to the ball bushing 14 with the intervention of the chuck support 8. When the motor 10 is actuated, the drive is transmitted to the gear 11, the ball screw 12, the lever 13 and the ball bushing 14, in the named order, as described hereinbefore, whereby the upward or downward movement of the wafer chuck 3 which is in a direction substantially perpendicular to the wafer loading surface 3a thereof is allowed.

As best seen in FIG. 2, a plurality of wafer-attracting evacuating exhaust grooves 4—4 are formed concentrically on the wafer loading surface 3a of the wafer chuck 3. Also, between two circular evacuating grooves 4 at an intermediate portion of the wafer chuck 3 surface, there are provided three small-diameter throughbores 5a, 5b and 5c, as described. Within each of the these throughbores 5a-5c, corresponding one of the hollow or tubular wafer abutment pillars 6a-6c is disposed.

The wafer conveying hand 2 is operable to hold, by attraction, a peripheral portion of the backside face of a wafer 1 and to convey the same wafer onto the upper end faces of the wafer abutment pillars 6a-6c from a prealignment device (not shown) by which the wafer 1 can be relatively coarsely aligned, preparatorily. It should be noted that the upper end faces of the wafer abutment pillars 6a-6c (namely, the wafer loading end faces) are retained at the same height (or the same position with respect to the Z direction) as the prealignment device (not shown).

When, in the operation with the described structure, a wafer 1 is going to be placed on the wafer chuck 3, first the wafer chuck 3 is moved downwardly to a position which is lower than the upper end faces of the wafer abutment pillars 6a-6c. On the other hand, the wafer 1 is conveyed to the prealignment device, not shown, by use of a conveying means, also not shown in the drawings. At the station of the prealignment device, the wafer is prealgined so that its flat outer peripheral edge portion, called an "orientation flat", extends in a predetermined direction within the X-Y plane. Thereafter, by the conveying hand 2, the wafer is conveyed onto the wafer stage device.

Subsequently, the wafer 1 whose back-side face is attracted and held by the conveying hand 2 is placed on the wafer abutment pillars 6a-6c. At this time, the evacuating exhaust passageways 7a-7c in the wafer abutment pillars 6a-6c are evacuated so that vacuum is applied to the bottom surface of the wafer 1. Thus, the wafer 1 is temporarily attracted to and held by the wafer abutment pillars 6a-6c. Then, the attraction by the conveying hand 2 is released and the hand 2 disengages from the wafer 1 and moves backwardly. After this, the wafer chuck 3 moves upwardly and comes close to the wafer 1 while evacuating the evacuating exhaust grooves 4—4. In the course of the upward movement of the wafer chuck 3 to a position higher than the upper end faces of the wafer abutment pillars 6a-6c, the wafer 1 is transferred onto the wafer chuck 3 surface from the wafer abutment pillars 6a and is held on the upper surface of the wafer chuck 3 by attraction.

As described, the wafer abutment pillars 6a-6c do not move, but a wafer 1 is transferred onto the wafer chuck 3 surface by the upward movement of the wafer chuck 3. Therefore, there is no possibility of shift of the position of the wafer 1 having been prealigned. Accordingly, there is no possibility of damaging the prealignment accuracy. Further, since the wafer abutment pillars 6a-6c for temporally supporting and holding a wafer 1 are provided within the wafer chuck 3, there is no necessity of forming a notch or slot at the outer peripheral portion of a wafer chuck, for allowing access of a wafer conveying hand. Therefore, simply with a small diameter of each wafer abutment pillar (6a, 6c, 6c) and with a small diameter of each throughbore (5a, 5b, 5c) into which the wafer abutment pillar is inserted, the undesirable deterioration of the flatness correcting performance of the wafer loading surface 3a of the wafer chuck 3 can be effectively prevented. From the results of experiments, it has been confirmed that there is substantially no deterioration of the flatness correcting performance with a diameter of each throughbore (5a, 5b, 5c) not greater than 10 mm.

While, in the foregoing, the invention has been described with reference to a wafer holding device incorporated into a semiconductor microcircuit manufacturing exposure apparatus, the invention is not limited to such a wafer holding device but is applicable also to a holding device for holding any other planar plate-like article such as, for example, a glass base plate used for the manufacture of a liquid crystal panel display device.

While the invention has been described with reference to the structures disclosed herein, it is not confined to the details set forth and this application is intended to cover such modifications or changes as may come within the purposes of the improvements or the scope of the following claims.

What is claimed is:

1. A device for holding a planar plate-like article, comprising:

a base member;

a chuck having an attracting surface effective to correct the flatness of the plate-like article when the plate-like article is attracted thereto, said chuck being mounted to said base member for movement in a direction substantially perpendicular to said attracting surface;

a plurality of support pillars fixedly mounted to said base member and having supporting faces, respectively, for supporting the plate-like article, and each of said support pillars is adapted to attract the plate-like article at its supporting face by vacuum attraction, said chuck being formed with a plurality of throughbores each extending from said attracting surface and in the direction, and wherein each of said support pillars extends through corresponding one of said throughbores; and a driving mechanism for moving said chuck in the direction relative to said base member, such that the plate-like member is supported first by said supporting faces of said support pillars and thereafter is held by said attracting surface of said chuck.

2. A device for holding a planar plate-like article, comprising:

a base member;

a chuck having an attracting surface effective to correct the flatness of the plate-like article when the article is attracted thereto, said chuck being mounted to said base member for movement relative thereto;

a plurality of support pillars having supporting faces, respectively, for supporting the plate-like article, said support pillars being retained fixed with respect to said base member, and each of said support pillars being adapted to attract the plate-like article at its supporting face by vacuum attraction; and a driving mechanism for moving said chuck relative to said base member and between a first position at which said supporting faces of said support pillars project from said attracting surface of said chuck and a second position at which said supporting faces of said support pillars are substantially accommodated within said chuck.

3. A device according to claim 2, wherein said chuck is formed with a plurality of throughbores each extending from said attracting surface of said chuck in the direction of the movement of the chuck, and wherein each of said support pillars extends through corresponding one of said throughbores.

* * * * *

UNITED STATES PATENT AND TRADEMARK OFFICE
CERTIFICATE OF CORRECTION

PATENT NO. : 4,869,481

DATED : September 26, 1989

INVENTOR(S) : SHUICHI YABU ET AL.                Page 1 of 2

It is certified that error appears in the above-identified patent and that said Letters Patent is hereby corrected as shown below:   On the title page:

AT [56] REFERENCES CITED

Insert, --4,600,282  7/1986  Yamamura et al.
Foreign Patent Documents
60-105231  7/1985  Japan
61-105854  5/1986  Japan--.

AT [57] ABSTRACT

Line 23, "wafer." should read --wafer.  In this manner, the wafer is held by the wafer chuck by attraction.  With this arrangement, a wafer can be held exactly at a desired position without damaging the flatness correcting performance of the wafer chuck.--.

COLUMN 1

Line 68, "temporally" should read --temporarily--.

COLUMN 2

Figure 3:
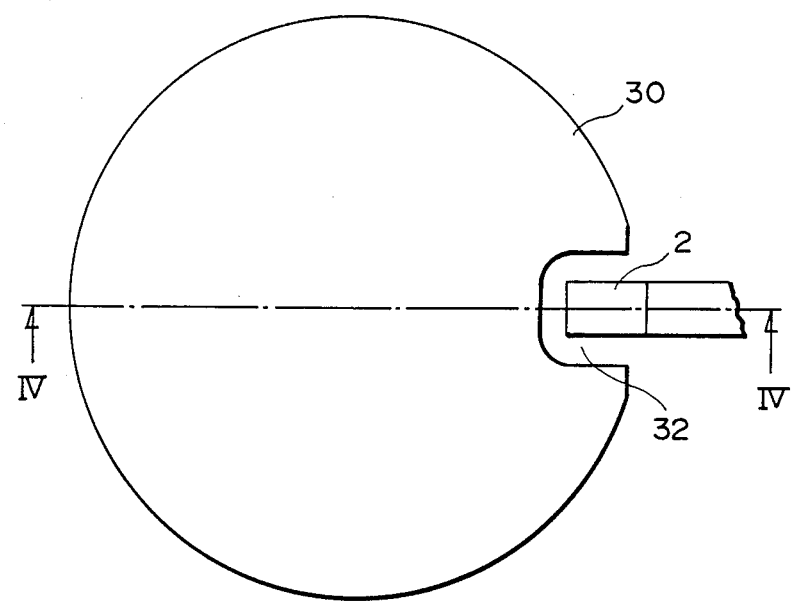
FIG. 3 is a plan view of a known type wafer stage.
Figure 4:
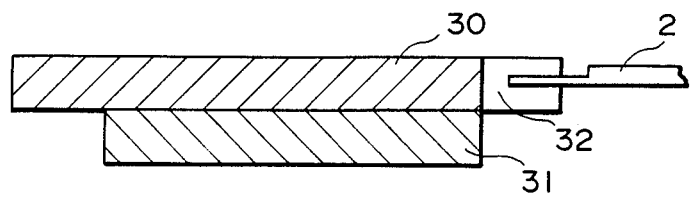
FIG. 4 is a sectional view of the wafer stage of the FIG. 3 taken on line IV—IV in FIG. 3.
Figure 5:
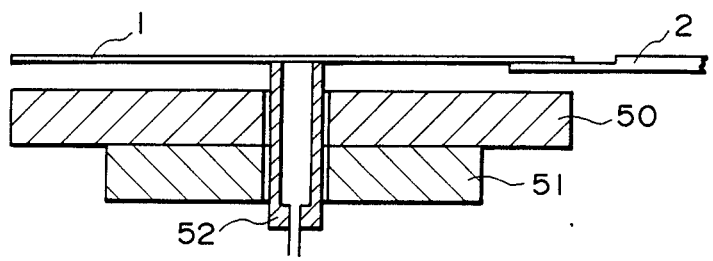
FIG. 5 is a sectional view showing another example of known type wafer stage.

Line 33, "temporally" should read --temporarily--.
Line 58, "FIG. 3 taken" should read
--FIG. 3 example, taken--.

COLUMN 3

Line 41, "Pillars 6a-6c" should read --pillars 6a-6c--.

UNITED STATES PATENT AND TRADEMARK OFFICE
CERTIFICATE OF CORRECTION

PATENT NO. : 4,869,481

DATED : September 26, 1989

INVENTOR(S) : SHUICHI YABU ET AL.

It is certified that error appears in the above-identified patent and that said Letters Patent is hereby corrected as shown below:

COLUMN 4

```
Line 3, Close up right margin.
Line 4, Close up left margin.
Line 16, "prealgined" should read --prealigned--.
Line 22, Close up right margin.
Line 23, Close up left margin.
Line 27, "temporally" should read --temporarily--.
Line 46, "temporally" should read --temporarily--.
```

Signed and Sealed this

Twelfth Day of March, 1991

Attest:

HARRY F. MANBECK, JR.

*Attesting Officer*  *Commissioner of Patents and Trademarks*